United States Patent [19]
Ferrant

[11] Patent Number: 6,091,650
[45] Date of Patent: Jul. 18, 2000

[54] REDUNDANCY FOR LOW REMANENCE MEMORY CELLS

[75] Inventor: Richard Ferrant, Saint Ismier, France

[73] Assignee: STMicroelectronics S.A., Gentilly, France

[21] Appl. No.: 09/321,023

[22] Filed: May 27, 1999

[30] Foreign Application Priority Data

May 29, 1998 [FR] France ................................. 98 06970

[51] Int. Cl.[7] .................................................... G11C 7/00
[52] U.S. Cl. .......................................... 365/200; 365/201
[58] Field of Search .................................. 365/200, 201, 365/185.09; 371/10.2, 10.3, 22.5

[56] References Cited

U.S. PATENT DOCUMENTS

| | | | |
|---|---|---|---|
| 4,473,895 | 9/1984 | Tatematsu | 365/200 |
| 5,381,370 | 1/1995 | Lacey et al. | 365/200 |
| 5,563,832 | 10/1996 | Kagami | 365/200 |
| 5,889,713 | 3/1999 | Chan et al. | 365/201 |
| 6,011,734 | 1/2000 | Pappert | 365/201 |

FOREIGN PATENT DOCUMENTS

0590809A2 4/1994 European Pat. Off. .

OTHER PUBLICATIONS

Hiroki Koike, et al. "A 30ns 64Mb DRAM with Built–in Self–Test and Repair Function", IEEE International Solid State Circuits Conference, vol. 35, Feb. 1, 1992, p. 150–151.
French Search Report dated Feb. 8, 1999 with annex on French Application No. 9806970.

*Primary Examiner*—Tan T. Nguyen
*Attorney, Agent, or Firm*—Theodore E. Galanthay; Fleit, Kain, Gibbons, Gutman & Bongini PL

[57] ABSTRACT

A memory device includes a defect memory, a test circuit, and a spare memory. The defect memory and the spare memory have as many rows as the array, and each row of the defect memory and the spare memory are selected when the corresponding row of the array is selected. A test circuit locates defective cells of the array and writes addresses in the defect memory to indicate locations of the defective cells. Additionally, a control circuit selects a row of the array based on a selected row address and redirects access to the corresponding row of the spare memory whenever a selected column address corresponds to one of the addresses stored in the defect memory. In one preferred embodiment, each of the rows of the defect memory stores information indicating if there is a defective cell in the corresponding row of the array and the column address of the defective cell. A computer system including such a memory device is also provided.

20 Claims, 5 Drawing Sheets

6,091,650

REDUNDANCY FOR LOW REMANENCE MEMORY CELLS

CROSS-REFERENCE TO RELATED APPLICATIONS

This application is based upon and claims priority from prior French Patent Application No. 98-06970, filed May 29, 1998, the entire disclosure of which is herein incorporated by reference.

BACKGROUND OF THE INVENTION

1. Field of the Invention

The present invention relates to semiconductor memory devices, and more specifically to circuitry for correcting a memory device in which some cells have low remanence.

2. Description of Related Art

An important feature of the performance of a dynamic random access memory device (DRAM) is the refreshment time, which is the maximum time that can pass between refreshments of the memory contents without degrading the stored information. A memory cell having a long refreshment time is said to have a high remanence. In spite of the progress made in manufacturing reliability, a memory device still can have manufacturing defects that make it inoperative (e.g., due to the introduction of an impurity during manufacturing). When such a defect appears in the memory array circuitry, which is relatively frequent due to the predominate surface of the array with respect to the memory surface, due to the great regularity of the structure of a memory array it is possible to easily replace the array area containing the defect with an identical spare area provided for this purpose.

FIG. 1 shows a conventional 1-megabit DRAM. The array 10 of the DRAM is organized into 1024 columns of 1024rows, with the columns being gathered in eight sets D0 to D7 of 128 columns to define 1024×128 8-bit words. Additionally, spare columns 12 of 1024 rows are located close to the array columns. A row decoder 14 selects a row from among the 1024 in the array and spare columns based on a row address ROW. A control circuit 16 receives a column address COL and selects the group of eight columns corresponding to this address. The control circuit also includes a non-volatile memory 18 that can be programmed so that a spare column systematically corresponds to a specific column address, instead of the array column that normally corresponds to this address. Thus, once the non-volatile memory has been programmed, it is possible to systematically replace some array columns considered to be defective with the spare columns, transparently for the user, for the write and read operations in the memory.

To determine whether a column is defective (i.e., whether it contains a defective cell), before being sold the memory is tested by a machine that performs several writings and readings over all array cells. The cell defects that are searched are redhibitory defects such as those that block the value provided by a memory cell or neighboring memory cells. The successive test writings and readings follow a predetermined sequence to locate with certainty all defective cells in the array. When the testing locates a defective cell, the non-volatile memory of the control circuit is programmed to replace the defective column with a spare column.

The non-volatile memory of the circuit is known as a "fuse box" and can be accessed from the circuit surface, with the memory programming being performed by fusing a combination of fuses using a laser beam. A relatively large number of fuses typically must be fused to correct a defect, and thus such laser programming does not have very high reliability. As a result, it is generally chosen not to correct more than about ten defects per array. If an array has a higher number of defects, the tester will reject the memory device as irreparable. This restricted number of repairs limits the necessary number of spare columns, and thus limits the surface and cost increase of the DRAM. As an example, one spare column is typically provided for 64 or 128 functional array columns.

In addition to the type of redhibitory defect described above, there is a type of defect known as a memory point remanence defect that alters the operation of a DRAM. A remanence defect, which is caused by physical characteristics (e.g., crystal dislocations or impurities in the material), results in an abnormally fast loss of information in a memory point. The occurrence of such defects forces the user to refresh the information stored in the DRAM more often than in the absence of such defects. In practice, a DRAM having such defects must be sold with lower guaranteed performance (i.e., a shorter refresh interval), and thus with lower functionality and a lower price.

Further, this type of defect generally appears in a large number of cells. As an example, in DRAM arrays produced using conventional manufacturing methods, approximately 10 to 100 cells per million have a low remanence. Because these low remanence cells are distributed randomly, a very large number of columns can be affected by having at least one cell with a defect. To repair such a large number of cells through conventional memory array repair techniques (such as described above with respect to FIG. 1) would require increasing the surface of the array by at least 30% in order to include the necessary number of spare columns.

Additionally, the programming of the non-volatile memory of the decoder would require the laser fusing of a large number of fuses, and the poor reliability of such an operation would adversely affect the quality of the repairs. For example, assuming that the probability of properly fusing a fuse with a laser is 99.5% and that 20 fuses have to be fused to correct an address, the probability of properly performing the correction of 50 addresses is $((0.995)^{20})^{50} \approx 0.006$, which is extremely low. Further, the spare columns themselves can also include defects (statistically, 30% of the spare columns). Thus, it is not possible to correct such defects unless very large and costly additional circuitry is provided.

SUMMARY OF THE INVENTION

In view of these drawbacks, it is an object of the present invention to overcome the above-mentioned drawbacks and to provide a reliable and economical circuit for repairing a memory array having a relatively large number of low remanence cells. A memory device includes a repair circuit that allows spare memory cells to be reliably substituted for low remanence cells.

One embodiment of the present invention provides a memory device that includes a defect memory, a test circuit, and a spare memory. The defect memory and the spare memory have as many rows as the array, and each row of the defect memory and the spare memory are selected when the corresponding row of the array is selected. A test circuit locates defective cells of the array and writes addresses in the defect memory to indicate locations of the defective cells. Additionally, a control circuit selects a row of the array based on a selected row address and redirects access to the corresponding row of the spare memory whenever a selected column address corresponds to one of the addresses stored in the defect memory. In one preferred embodiment, each of the rows of the defect memory stores information indicating if there is a defective cell in the corresponding row of the array and the column address of the defective cell. Another embodiment of the present invention provides a computer system that includes such a memory device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

The redhibitory defects described above can only be precisely detected by using a complex sequence of test vectors that are written into and read from the array cells, because each defect can have various consequences (e.g., bonding or coupling). A test of the array for finding such defects is of very large implementation and it is difficult and costly to adapt such a test to a test device that is integrated with the DRAM. On the other hand, it has been noted that the remanence defects of DRAM cells have single and individualized effects. Thus, it is possible to very precisely determine defective cells with a reduced number of test vectors for each cell, and such testing can be implemented by a relatively simple test circuit that is integrated with the DRAM.

To correct defects of low remanence of the cells in a DRAM array, a test circuit is provided for checking the validity of each cell in the array and a dynamic defect memory having rows selected at the same time as the array rows is provided for storing the column address of the cells that are found to be defective. In normal mode, during access to a cell in a row of the array, a control circuit receives the address stored for that row from the defect memory . If the address of the cell being accessed corresponds to the stored address, the cell is defective and the control circuit switches from accessing the defective cell to a spare cell belonging to the same row of a spare column.

Figure 1:
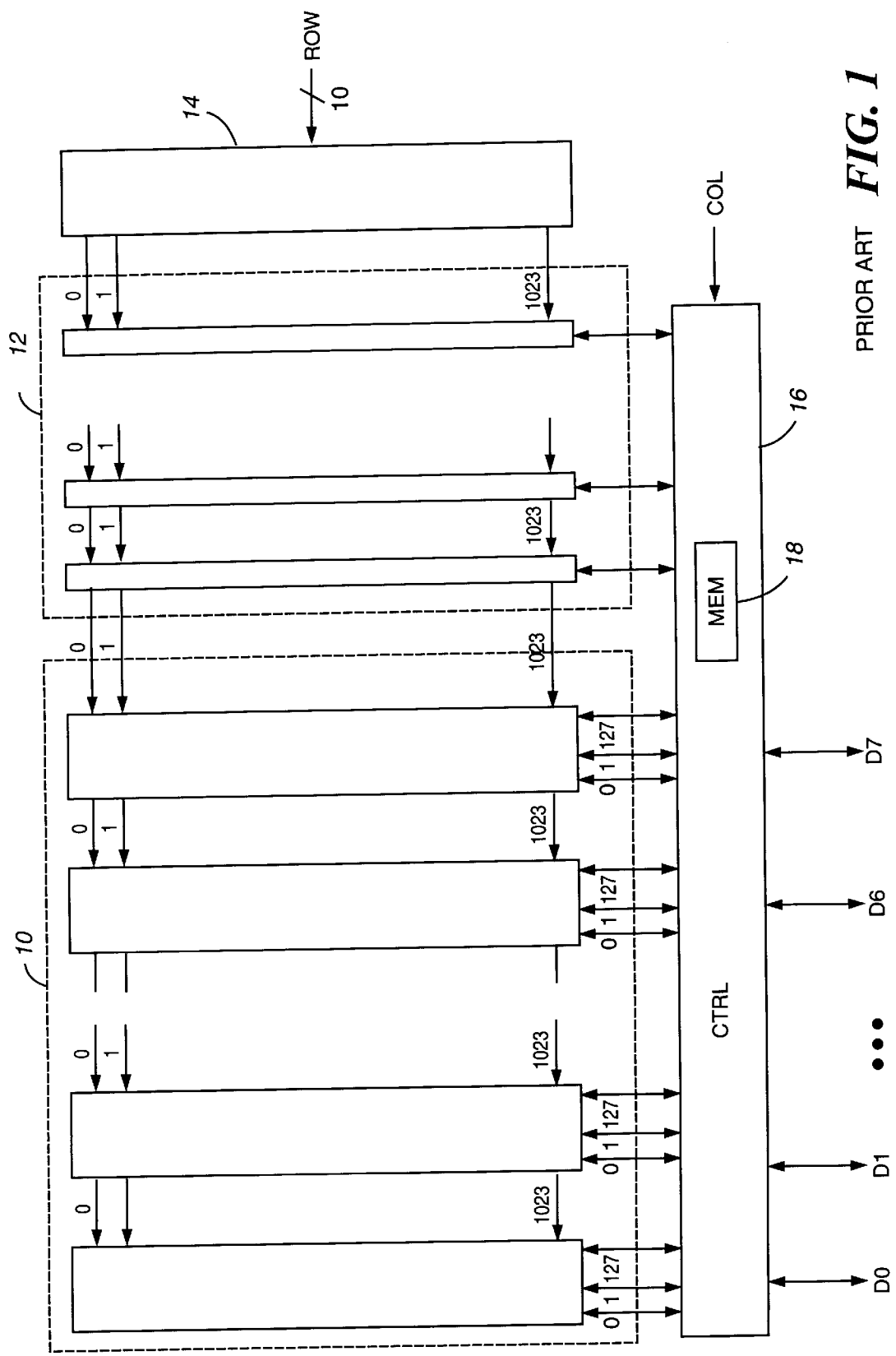
FIG. 1 shows a DRAM array having conventional repair circuitry.
Figure 2A:
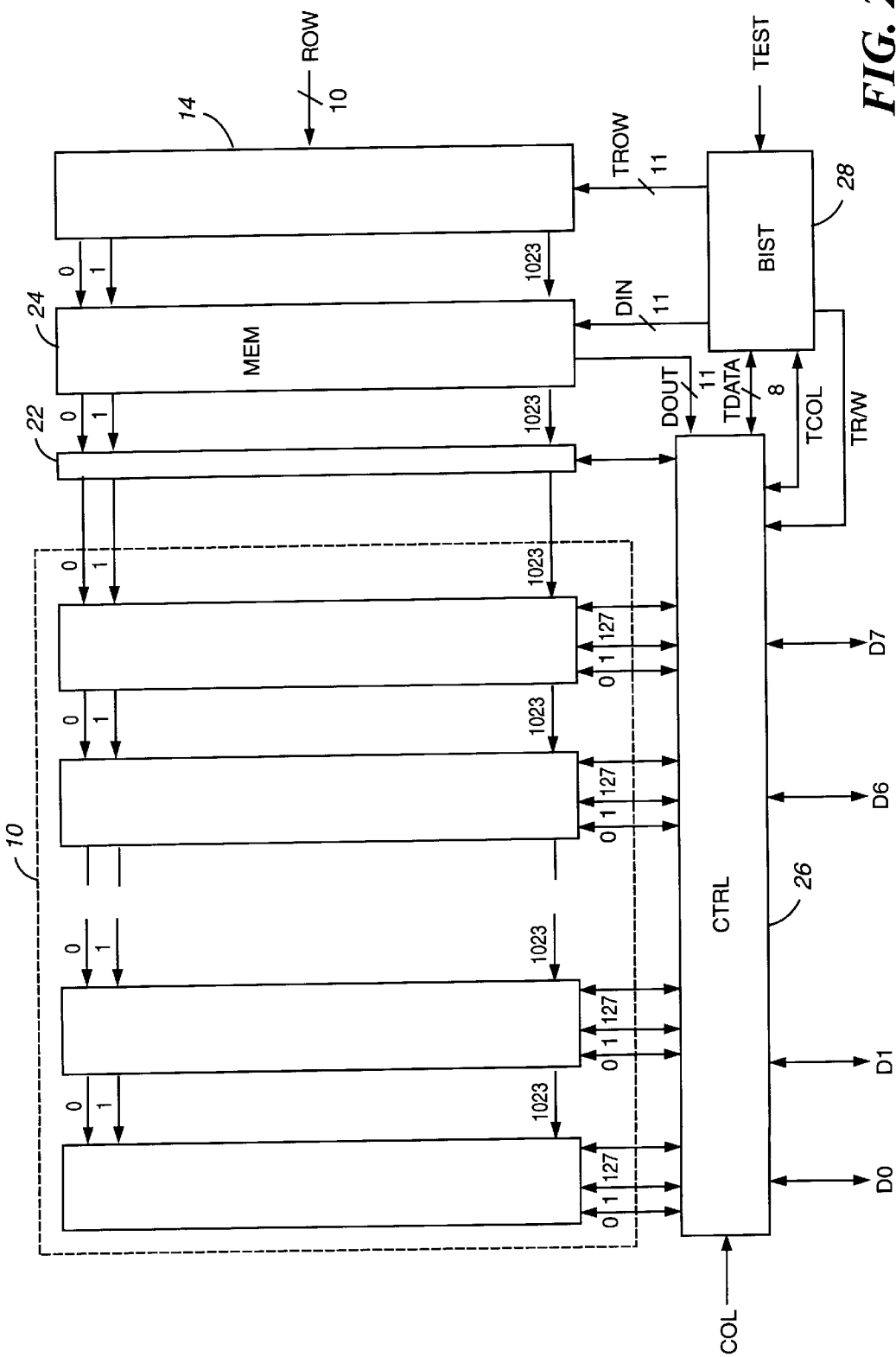
FIG. 2A shows a DRAM array having a repair circuit according to one embodiment of the present invention.

FIG. 2A shows a 1-megabit DRAM according to an embodiment of the present invention. The array 10 and the row decoder 14 of the DRAM are identical to the similarly designated elements of FIG. 1. Additionally, the memory includes a spare column 22 of 1024 rows, each of which is selected at the same time as a corresponding row of the array. A defect memory 24 includes 1024 11-bit words, each of which is also selected at the same time as the corresponding row of the array. A control circuit 26 receives a column address COL and selects the group of eight columns that corresponds to the address, and receives the words coming from defect memory 24. An automated test circuit 28 receives a control signal TEST for setting the device to the test mode and provides control signals to elements 14, 24, and 26 of the device.

When the test mode is activated by activating signal TEST, the test circuit 28 controls the row decoder 14 and the control circuit 26 through signals TCOL, TROW, and TR/W in order to write and then read predetermined test values TDATA for each cell of the array. If a read value does not correspond to the test value previously written in a cell, the cell is considered defective. Therefore, the test circuit 28 writes the column address of the defective cell over a bus DIN and updates a flag that indicates the presence of a defect in the defect memory 24. The row address of the word written into the defect memory is that of the row containing the defective cell. If the test circuit does not detect any defective cells in a row, this is indicated by the state of the flag of the corresponding row in the defect memory 24. After each cell of the array has been tested, the DRAM is set to the normal mode.

During access to the DRAM in normal mode, the defect memory 24 is in read mode and receives the current row address (i.e., the address of the row desired to be accessed). For each address, the defect memory provides a word formed of a column address and a flag to the control circuit 26 over a bus DOUT. The control circuit 26 simultaneously receives the address COL of the column to which access is desired and the 11-bit word for the current row from the defect memory. If the flag from the defect memory indicates that the row contains a defective cell, the control circuit 26 compares the desired column address with the column address received from the defect memory. When these two addresses are the same, the control circuit switches access to the cell of the row in the spare column.

Figure 2B:
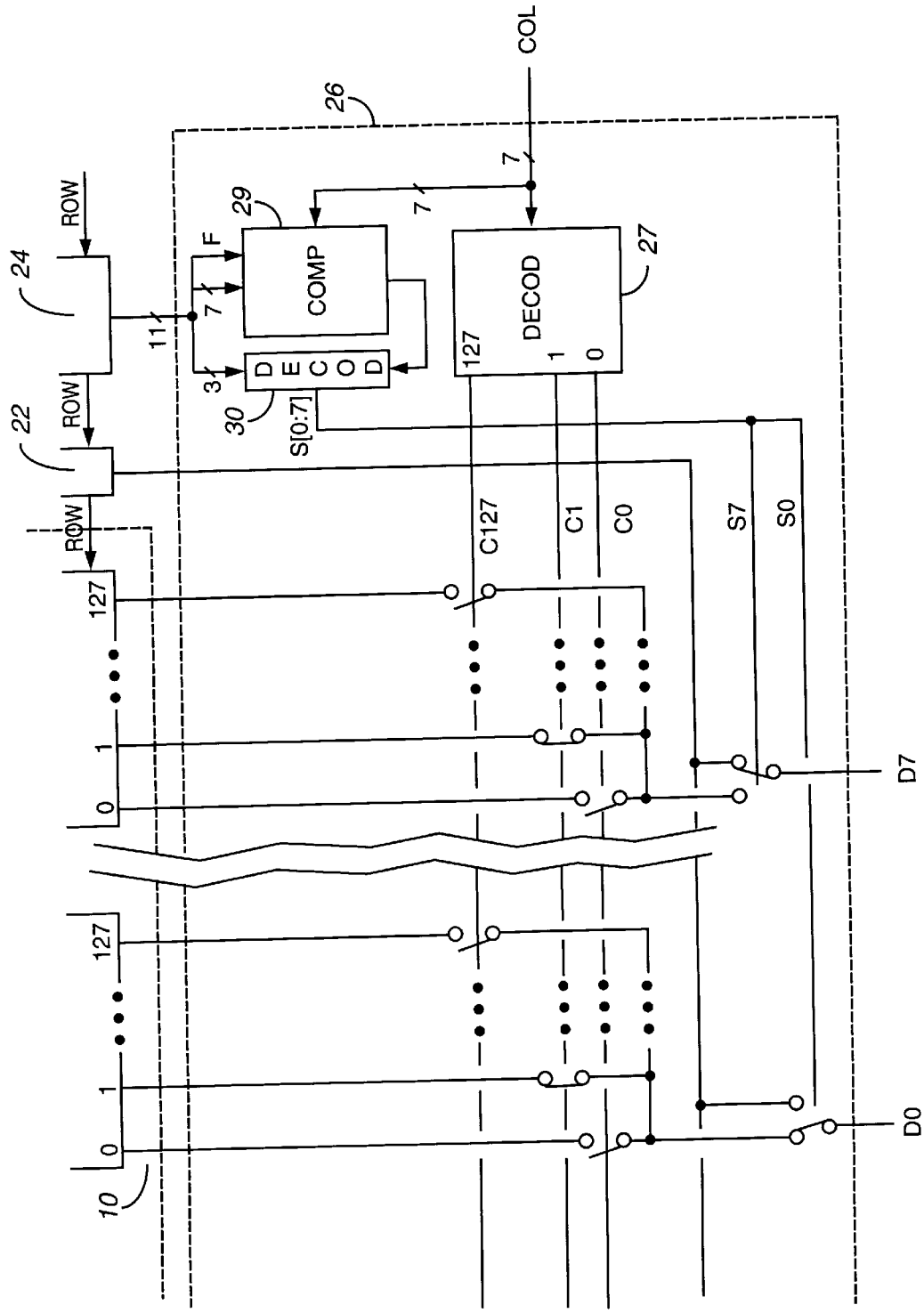
FIG. 2B shows one embodiment of a control circuit for a DRAM array in accordance with the present invention.

FIG. 2B shows further detail of one embodiment for the control circuit of FIG. 2A. A decoder 27 activates one of 128 selection signals C0 to C127 according to the current column address COL such that the number of the activated selection signal corresponds to the decimal value of the column address COL. Each selection signal is used to activate one of the 128 columns of each of the eight column blocks D0 to D7 of the DRAM array 10, with the array 10 being organized into rows of 128 8-bit words and the column address COL being coded over 7 bits to enable access to one of the 128 words. The defect memory 24 contains a flag F and a complete 10-bit column address (i.e., the 7 bits corresponding to the column address of the word containing a defect and 3 bits identifying the location of the defect within the eight-bit word) for each row.

When the flag F is active, a comparator 29 compares the current column address COL with the 7 most significant bits of the 10-bit column address provided by the defect memory 24. When the comparator 29 determines that these addresses are the same, the 8-bit word corresponding to the current address contains a defective cell. Therefore, the comparator 29 activates a decoder 30 that receives the three least significant bits and generates eight switching signals S0 to S7, a single one of which is active according to the decimal value represented by the 3 bits. The active switching signal S0 to S7 replaces the access to one of the eight groups D0 to D7 with an access to the spare column 22. For example, in FIG. 2B, decoder 27 selects the second column of each group of eight columns, and after a defect has been detected, decoder 30 switches from accessing group D7 to accessing the spare column.

Figure 2C:
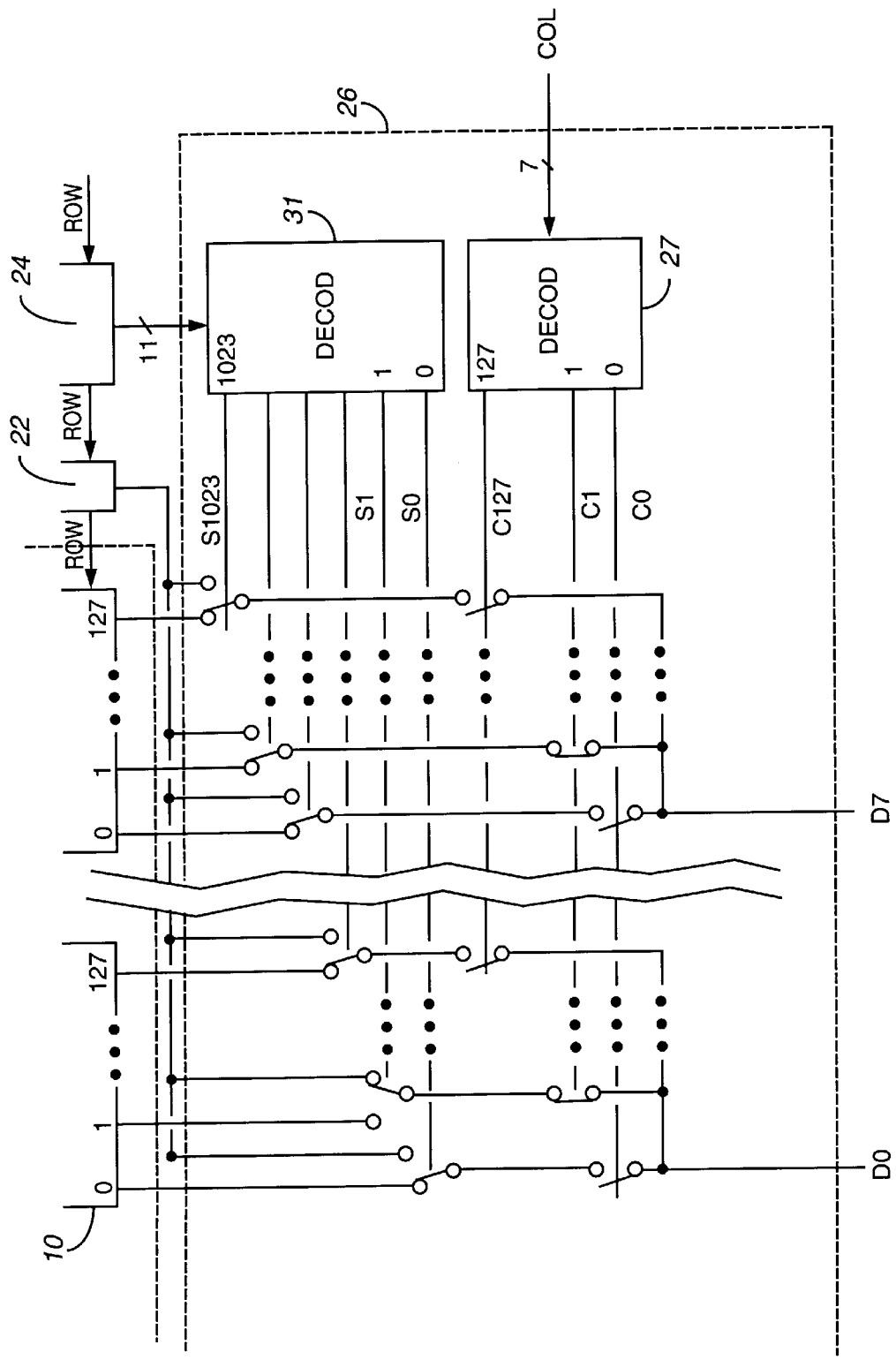
FIG. 2C shows another embodiment of a control circuit for a DRAM array in accordance with the present invention.

FIG. 2C shows detail of another embodiment for the control circuit of FIG. 2A. A decoder 27 similar to that in FIG. 2B activates one of the 128 selection signals C0 to C127 according to the current column address COL. Further, another decoder 31 receives the flag F and the 10-bit column address from the defect memory 24. When the flag F is active, the decoder 31 generates a switching signal S0 to S1023, a single one of which is active according to the decimal value represented by the 10 bits. The active switching signal S0 to S1023 replaces access to one of the 1024 columns with an access to the spare column 22.

For example, in FIG. 2C, decoder 27 selects the second column of each group of eight columns, and after a defect has been detected, decoder 31 replaces any access to the second column of array 10 with an access to the spare column. This embodiment shortens the response time of the DRAM by suppressing the relatively long time for comparing the address stored in the defect memory with the current column address. However, such an embodiment requires a large number of additional logic gates to form the decoder 31. Thus, in practice, one of the two embodiments described above can be chosen depending on whether it is preferable to have a small or a fast device.

In the preferred embodiments, the defect memory is a DRAM so the stored data has to be periodically refreshed. If the DRAM is idle (e.g., powered-down or not refreshed), it becomes necessary to repeat the automated testing of the array upon powering-on. It is possible to precisely determine the defective cells using a reduced number of writings and readings of a predetermined test value in each cell (as explained above). Thus, the automated testing of each array cell that is performed upon each powering-on is relatively short and the testing circuit can have a relatively simple structure.

Figure 3:
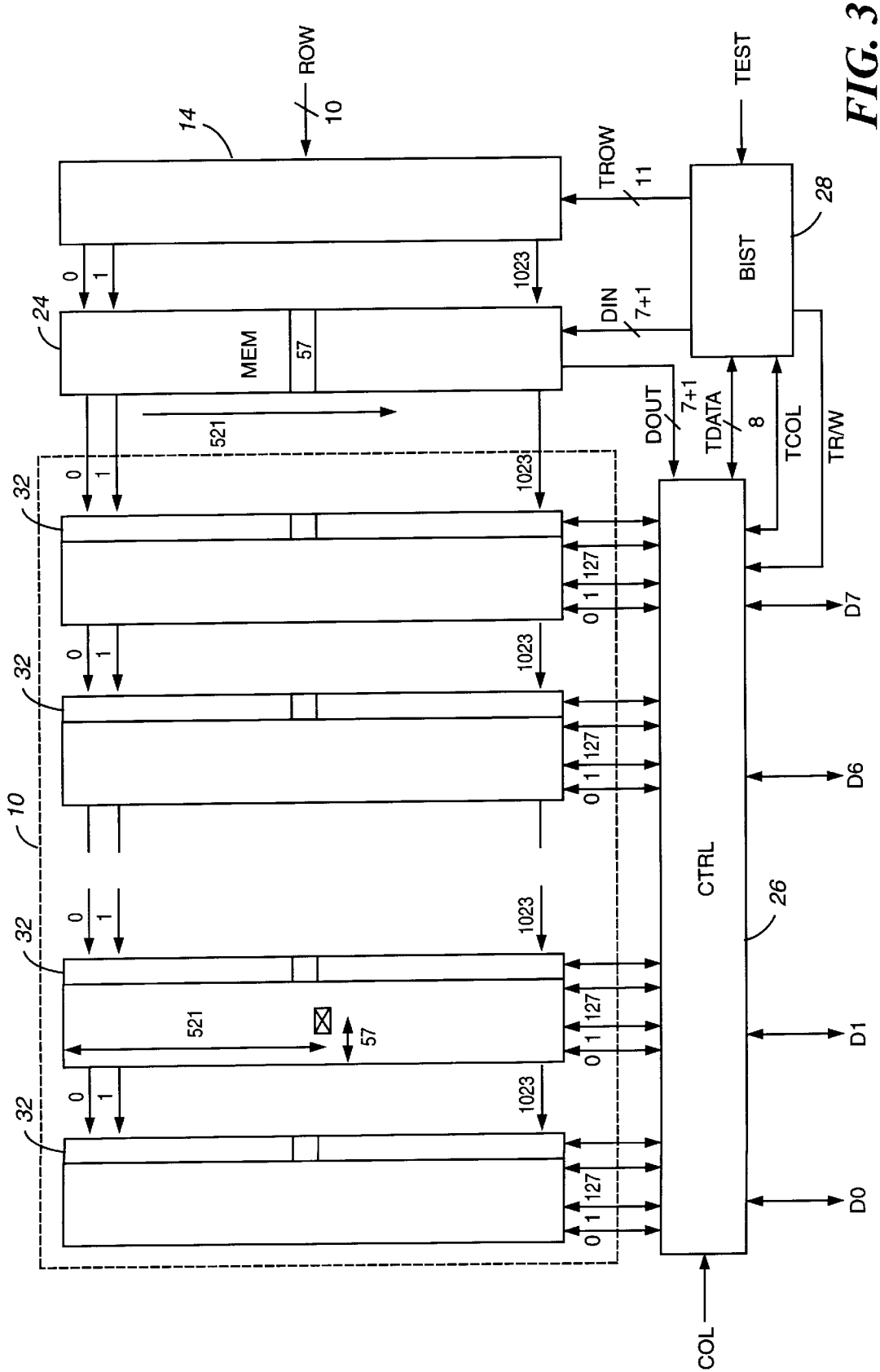
FIG. 3 shows a DRAM array that is repairable in accordance with another embodiment of the present invention.

FIG. 3 shows another embodiment of the present invention. In this embodiment, the spare column 22 of FIG. 2A is replaced with eight spare columns 32, each of which is associated with one of the eight groups of 128 columns of the DRAM array 10. The same references in FIGS. 2A and 3 designate elements having the same function. Furthermore, in the device of FIG. 3, the automated testing of the DRAM array is performed as described above with reference to the testing circuit of FIG. 2A. In normal mode, if the address to which access is desired corresponds to a defective cell, the control circuit 26 switches from accessing the (entire) 8-bit word containing the defective cell to a spare word formed of the eight cells of the same row of the eight spare columns.

For example, if the cell of column 57 of row 521 of the second group of columns D1 is defective, column address 57 is stored along with an active flag in row 521 of the defect memory. Then, the control circuit replaces all accesses to a cell of column 57 of any of groups D0 to D7 with access to the cell of row 521 of the spare column associated with the same group. While such a device requires eight times more spare cells than the device of FIG. 2A, it has the advantage of being much easier to implement, especially with respect to the adaptation and balancing of the loads of the data lines leading to the spare columns when the topography of the DRAM circuit is patterned on silicon.

Embodiments of the present invention described above with respect to FIGS. 2A and 3 enable one repair per row, or 1024 repairs in the illustrated embodiments. In most cases, this will provide wide coverage for the previously-mentioned 10 to 100 defects per one million. Further, the necessary size increase of the DRAM is much smaller than 5%, as compared with at least 30% according to conventional techniques (and 100% or more to guarantee 1000 repairs).

While embodiments enabling correction of at most one defective cell per row have been described above, there remains a risk that the memory array has two or more defective cells per row. Such a memory would be considered defective with the devices of FIGS. 2A and 3. However, one of ordinary skill in the art can easily adapt the illustrated embodiments of the present invention to enable replacement of a larger number of defective cells per row (e.g., by using twice or more the principle of coding an address in the defect memory).

Similarly, the devices described above with respect to FIGS. 2A and 3 use a dynamic defect memory that must be refreshed and updated upon each powering-on. However, further embodiments replace the dynamic memory with a non-volatile memory (e.g., a memory formed of OTP cells). If an embodiment of the present invention uses a non-volatile defect memory, it becomes unnecessary to restart array testing upon each powering-on of the DRAM. Further, non-volatile memory cells are generally easier to implement and a DRAM that does not have to be tested upon each powering-on is easier to use. It is noted that by operating at the technological limit of recent methods, it is possible to make OTP cells without an additional processing step, and thus without additional cost. While such cells have mediocre performance as compared to conventional EPROM cells, an OTP cell has the same size as a DRAM cell and thus can advantageously be used in the defect memory.

Additionally, in order to guarantee optimal reliability in the memory device of the present invention, it is possible to combine a conventional repair circuit of the type shown in FIG. 1, which enables replacement of a column having an inoperative cell, and a repair circuit according to the present invention. Such a combination enables conventional testing of the spare column or columns added by the present invention and guarantees that such columns do not include inoperative cells. The low additional surface cost of implementing both techniques enables such simultaneous use. Further, the present invention has been described above in relation to a given array size and organization. However, one of ordinary skill in the art can easily adapt the present invention to any other memory organization, size, or structure.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A memory device of the type having memory cells organized into an array of rows and columns, said memory device comprising:

a test circuit for locating defective cells of the array;

a defect memory for storing information about the location of the defective cells, the test circuit writing the information in the defect memory to indicate addresses of the defective cells in the array;

a spare memory including as many rows as the array, each row of the spare memory being selected when the corresponding row of the array is selected; and a control circuit for selecting one of the rows of the array based on a selected row address and for redirecting access to one of the rows of the spare memory whenever a selected column address corresponds to one of the addresses stored in the defect memory.

2. The memory device as defined in claim 1, wherein the defect memory includes as many rows as the array, each row of the defect memory being selected when the corresponding row of the array is selected.

3. The memory device as defined in claim 2, wherein each of the rows of the defect memory stores information indicating if there is a defective cell in the corresponding row of the array and, if there is such a defective cell, the column address of the defective cell.

4. The memory device as defined in claim 3, wherein when the row of the defect memory that corresponds to the selected row stores the selected column address, the control circuit redirects access to the corresponding row of the spare memory.

5. The memory device as defined in claim 3, wherein the control circuit includes a comparator for enabling the redirection when the selected column address is equal to the column address stored in the corresponding row of the defect memory.

6. The memory device as defined in claim 3, wherein the control circuit includes a decoder, and for each selected row, the decoder receives the column address stored in the corresponding row of the defect memory and enables the redirection for the stored column address.

7. The memory device as defined in claim 1, wherein the defect memory is a volatile memory, and the test circuit operates each time the memory device is powered-on.

8. The memory device as defined in claim 1, wherein the defect memory is a non-volatile memory.

9. The memory device as defined in claim 8, wherein the defect memory includes OTP cells.

10. The memory device as defined in claim 1, wherein the memory device is a dynamic memory device.

11. A dynamic memory device having memory cells organized into an array of rows and columns, said memory device comprising:

a defect memory including as many rows as the array, each row of the defect memory being selected when the corresponding row of the array is selected;

a test circuit for locating defective cells of the array, the test circuit writing addresses in the defect memory to indicate locations of the defective cells in the array;

a spare memory including as many rows as the array, each row of the spare memory being selected when the corresponding row of the array is selected; and a control circuit for selecting one of the rows of the array based on a selected row address and for redirecting access to the corresponding row of the spare memory whenever a selected column address corresponds to one of the addresses stored in the defect memory.

12. The memory device as defined in claim 11, wherein each of the rows of the defect memory stores information indicating if there is a defective cell in the corresponding row of the array and, if there is such a defective cell, the column address of the defective cell.

13. The memory device as defined in claim 12, wherein when the row of the defect memory that corresponds to the selected row stores the selected column address, the control circuit redirects access to the corresponding row of the spare memory.

14. A computer system including at least one memory device having memory cells organized into an array of rows and columns, said memory device comprising:

a test circuit for locating defective cells of the array;

a defect memory for storing information about the location of the defective cells, the test circuit writing the information in the defect memory to indicate addresses of the defective cells in the array;

a spare memory including as many rows as the array, each row of the spare memory being selected when the corresponding row of the array is selected; and a control circuit for selecting one of the rows of the array based on a selected row address and for redirecting access to one of the rows of the spare memory whenever a selected column address corresponds to one of the addresses stored in the defect memory.

15. The computer system as defined in claim 14, wherein the defect memory includes as many rows as the array, each row of the defect memory being selected when the corresponding row of the array is selected.

16. The computer system as defined in claim 15, wherein each of the rows of the defect memory stores information indicating if there is a defective cell in the corresponding row of the array and, if there is such a defective cell, the column address of the defective cell.

17. The computer system as defined in claim 16, wherein when the row of the defect memory that corresponds to the selected row stores the selected column address, the control circuit redirects access to the corresponding row of the spare memory.

18. The computer system as defined in claim 16, wherein the control circuit includes a comparator for enabling the redirection when the selected column address is equal to the column address stored in the corresponding row of the defect memory.

19. The computer system as defined in claim 16, wherein the control circuit includes a decoder, and for each selected row, the decoder receives the column address stored in the corresponding row of the defect memory and enables the redirection for the stored column address.

20. The computer system as defined in claim 14, wherein the memory device is a dynamic memory device.

* * * * *